(12) United States Patent
Kimura et al.

(10) Patent No.: US 6,892,593 B2
(45) Date of Patent: May 17, 2005

(54) POLYHEDRON INSPECTION FEEDER AND POLYHEDRON INSPECTION APPARATUS

(75) Inventors: Takashi Kimura, Yamagata (JP); Kazuhiro Kikawa, Tokyo (JP)

(73) Assignee: Lintec Corporation, Tokyo (JP)

( * ) Notice: Subject to any disclaimer, the term of this patent is extended or adjusted under 35 U.S.C. 154(b) by 0 days.

(21) Appl. No.: 10/849,228

(22) Filed: May 20, 2004

(65) Prior Publication Data

US 2004/0211270 A1 Oct. 28, 2004

Related U.S. Application Data

(62) Division of application No. 10/181,374, filed as application No. PCT/JP01/11514 on Dec. 27, 2001.

(30) Foreign Application Priority Data

Dec. 28, 2000 (JP) ........................................ 2000-404981
Apr. 25, 2001 (JP) ........................................ 2001-127248

(51) Int. Cl.[7] ........................................... B65G 47/22
(52) U.S. Cl. ................................................. 73/865.8
(58) Field of Search ............................. 73/865.8–865.9; 250/223 R; 198/339.1, 345.1; 324/537, 752–753, 765; 356/237.1, 237.4, 237.5; 414/222.01, 222.04, 224.01, 226.04

(56) References Cited

U.S. PATENT DOCUMENTS

| | | | |
|---|---|---|---|
| 3,447,661 A | 6/1969 | Lakso et al. | 198/402 |
| 4,641,741 A | 2/1987 | Oura | 198/493 |
| 4,976,356 A | 12/1990 | Mizuno et al. | 198/345.1 |
| 5,638,940 A | 6/1997 | Aoyama et al. | 198/493 |
| 5,642,298 A | 6/1997 | Mallory et al. | 324/765 X |
| 5,775,478 A | 7/1998 | Shinjo | 198/389 |
| 5,986,235 A | 11/1999 | Canella | 219/121.68 |
| 6,012,344 A | 1/2000 | Halbo | 73/865.8 |
| 6,116,404 A | 9/2000 | Heuft et al. | 198/339.1 |

FOREIGN PATENT DOCUMENTS

| | | | |
|---|---|---|---|
| GB | 2299164 A | 9/1996 | G01N/21/87 |
| JP | 39-11714 | 6/1964 | |
| JP | 44-29090 | 11/1969 | |
| JP | 52-83184 | 6/1977 | B65G/47/00 |
| JP | 59-28353 | 2/1984 | 29/25 |
| JP | 4-308121 | 10/1992 | 198/377.02 |
| JP | 9-221217 | 8/1997 | B65G/47/14 |
| JP | 10-291635 | 11/1998 | B65G/47/30 |
| JP | 2000-157935 | 6/2000 | G01B/11/24 |

Primary Examiner—Thomas P. Noland
(74) Attorney, Agent, or Firm—Lowe Hauptman & Berner, LLP

(57) ABSTRACT

A polyhedron inspection apparatus 10 includes a polyhedron inspection feeder 12 having a passage forming member 22 for inspecting a surface of cubic chip W. The polyhedron inspection feeder 12 is formed with a V-letter groove, and includes two rotating feed sections 25A and 25B arranged on the midway of the passage forming member 22. The rotating feed sections 25A and 25B are individually formed with grooves having V-letter type, U-letter type and V-letter type sectional shapes in succession. The passage forming member 22 is provided with a shooter 18 for moving the chip W one by one in a state of being estranged from each other, and further, is provided with cameras 13A to 13D for inspecting the surface of the chip W, and retrieve element 30 for retrieving the chip W in accordance with the inspection result.

6 Claims, 12 Drawing Sheets

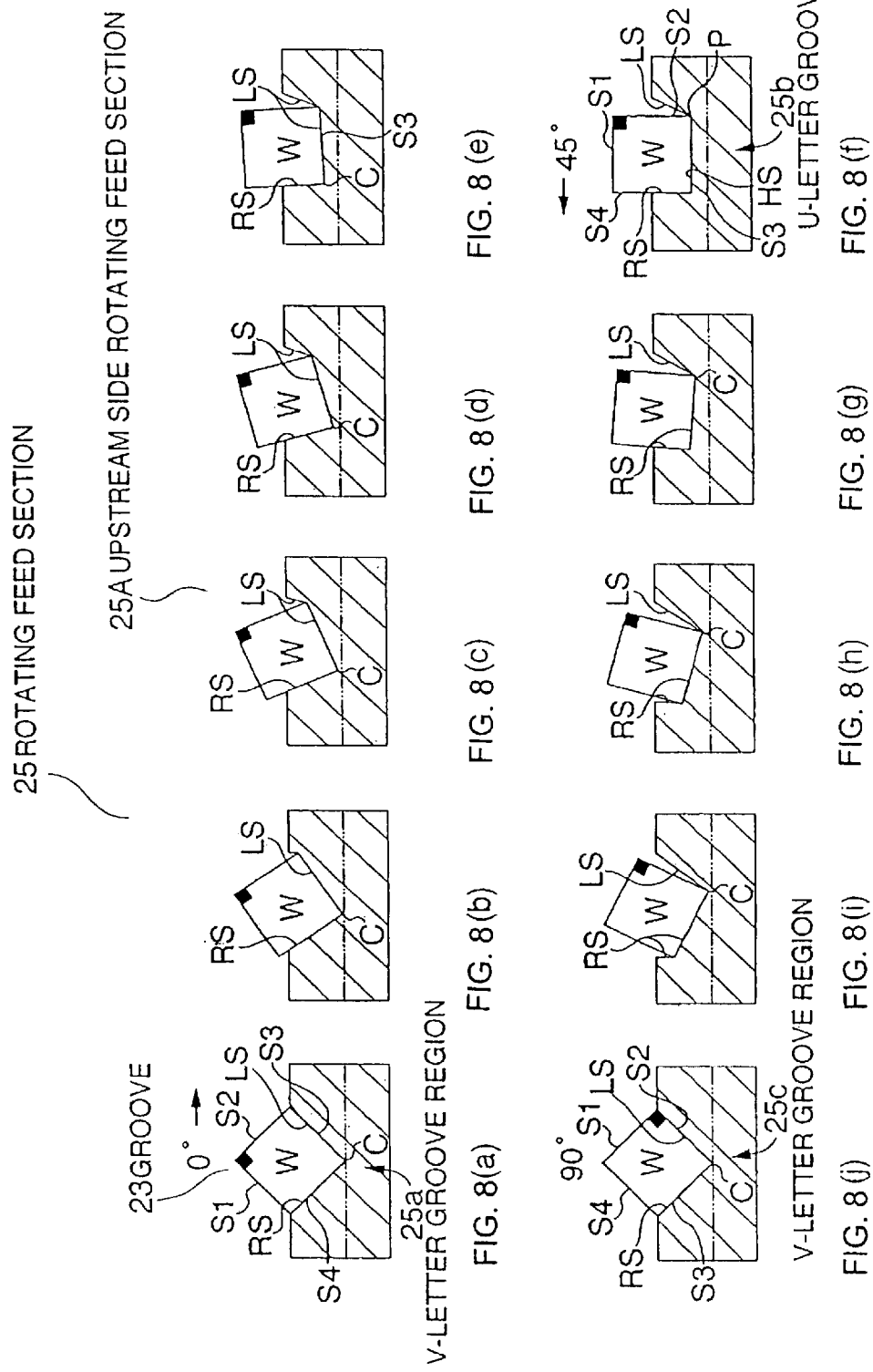

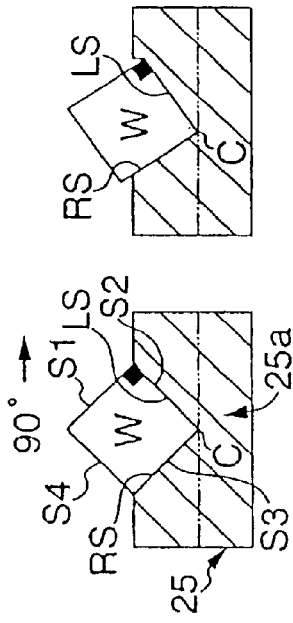
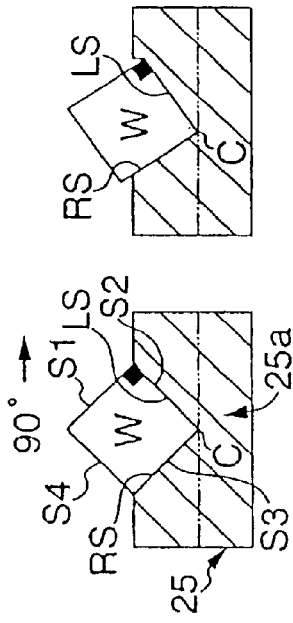
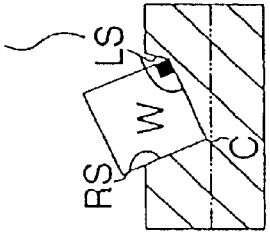
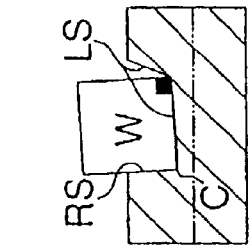
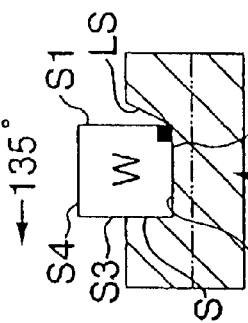
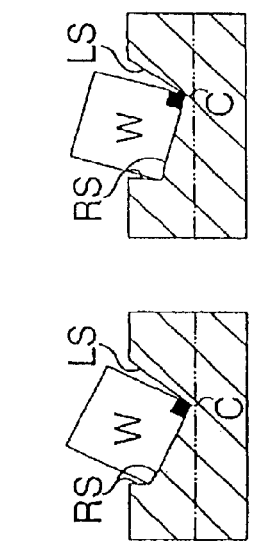
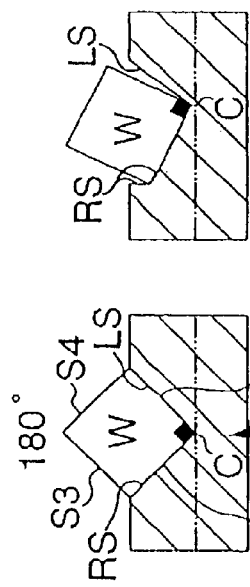

POLYHEDRON INSPECTION FEEDER AND POLYHEDRON INSPECTION APPARATUS

RELATED APPLICATIONS

This application is a divisional of U.S. patent application Ser. No. 10/181,374, filed Oct. 7, 2002, which is the National Stage of International Application No. PCT/JP01/11514 Dec. 27, 2001, Which claims priority of Japanese Application Nos. 2000-404981 and 2001-127248.

TECHNICAL FIELD

The present invention relates to a polyhedron inspection feeder and a polyhedron inspection apparatus, and in particular, to a polyhedron inspection feeder and a polyhedron inspection apparatus, which are suitable for inspecting a surface accuracy of inspection object such as chips of electronic components.

BACKGROUND ART

Conventionally, in the case of inspecting finish surface accuracy of electronic components such as chips, each surface of these chips has been inspected by a worker using a loupe or the like. However, in the above-mentioned inspection, the worker takes these chips by his hand one by one, and then, visibly inspects them; for this reason, there are many cases where defects such as micro scratch and deformation have been overlooked. As a result, this is a factor of mixing defectives in products. Further, the worker is fatigued with the inspection; for this reason, he has a heavy workload. In addition, a problem arises such that great unevenness is caused in inspection accuracy depending upon worker's skill.

In view of the above problem, for example, the following apparatus has been proposed in Japanese Utility Model Application Laid-Open (Kokai) No. 52-83184. The apparatus rotates an inspection object at a predetermined angle in a process for moving the inspection object while automatically inspecting it. The apparatus includes first and second conveyers, and is constructed in a manner of reversing the moving inspection object placed on the first conveyer, and transferring it onto the second conveyer, and further, inspecting a surface exposed on the upper side of the inspection object on each conveyer by a camera, and thereby, inspecting both sides of the inspection object.

However, the above apparatus requires a mechanism for reversing the inspection object between the first and second conveyers; for this reason, a problem arises such that the structure becomes complicate. Further, in order to reverse the inspection object, the first and second conveyers can not be linearly arranged; for this reason, a predetermined space is required in a vertical direction as conveyer arrangement space, whereby a problem arises such that the apparatus is made into a large size.

DISCLOSURE OF THE INVENTION

The present invention has been proposed in view of the problems. Accordingly, an object of the present invention is to provide a polyhedron inspection feeder and a polyhedron inspection apparatus, which can automatically and effectively inspect a surface of chip-like inspection object with high accuracy, and can miniaturize the device structure.

In order to achieve the above-mentioned object, the present invention provides a polyhedron inspection feeder including a passage forming member for moving an inspection object to a predetermined direction, characterized in that the passage forming member is formed into a shape of groove, and is provided with a rotating feed section, which includes a groove having right and left inclined angle changing along the moving direction of the inspection object so that the inspection object is rotated by a predetermined angle. With this arrangement, when the inspection object is moved on the passage forming member in a state of being placed in the groove, the inspection object is moved so as to rotate along a spiral locus. By doing so, it is possible to move the inspection object in a state that the inspection surface hidden in the groove at the initial movement is exposed. Therefore, it is possible to automatically, accurately and effectively inspect defects such as scratch and deformation on the surface of the inspection object by the predetermined inspection means without carrying out visible inspection. Further, the inspection object is moved while being rotated by the rotating feed section; therefore, it is possible to linearly provided the passage forming member, and thus, to achieve device miniaturization.

More specifically, in order to achieve the object, the present invention provides a polyhedron inspection feeder including a passage forming member for moving a polyhedral inspection object to a predetermined direction, characterized in that the passage forming member is formed into a shape of groove, and has an arrangement of V-letter type, U-letter type and V-letter type sectional groove shape, and further, is provided with a rotating feed section, which includes a groove having right and left inclined angle changing along the moving direction of the inspection object so that it is rotated by a predetermined angle.

Further, in order to achieve the object, the present invention provides a polyhedron inspection feeder including a passage forming member for moving a polyhedral inspection object to a predetermined direction, characterized in that the passage forming member is formed into a shape of groove, and has an arrangement of U-letter type, V-letter type and U-letter type sectional groove shape, and further, is provided with a rotating feed section, which includes a groove having right and left inclined angle changing along the moving direction of the inspection object so that the inspection object is rotated by a predetermined angle.

Moreover, according to the present invention, the upstream or downstream side of the rotating feed section having the arrangement of V-letter type, U-letter type and V-letter type sectional groove shape, maybe combined with the rotating feed section having the arrangement of U-letter type, V-letter type and U-letter type sectional groove shape. By doing so, the rotational angle of the inspection object can be twice by using the single rotating feed section.

Two rotating feed sections having the arrangement of V-letter type, U-letter type and V-letter type sectional groove shape may be continuously combined with each other, whereby the rotational angle of the inspection object can be twice, likewise.

In addition, two rotating feed sections having the arrangement of U-letter type, V-letter type and U-letter type sectional groove shape are continuously combined with each other. In this case, it is possible to obtain the same effect as the case where two rotating feed sections having the arrangement of V-letter type, U-letter type and V-letter type sectional groove shape are continuously combined with each other.

Further, the present invention provides a polyhedron inspection apparatus comprising:

a passage forming member for moving a polyhedral inspection object to a predetermined direction;

inspection means arranged at a near position along the passage forming member, and for inspecting each surface of the inspection object; and supply means arranged on an upstream side of the passage forming member, and for supplying the inspection object to the passage forming member, characterized in that the passage forming member is formed into a shape of groove, and is provided with a rotating feed section, which includes a groove having right and left inclined angle changing along the moving direction of the inspection object so that the inspection object is rotated by a predetermined angle, and further, the upstream side of the rotating feed section is provided with an estrangement feed section for the inspection object. With the configuration, it is possible to automatically inspect each surface of the polyhedral inspection object, and besides, even if the inspection object is continuously supplied from the supply means in a state of closely contacting with each other, the estrangement feed section for the inspection object forms a predetermined interval between the inspection objects. Therefore, it is possible to securely specify the inspection object one by one, and to carry out the inspection by the inspection means; as a result, an inspection mistake can be prevented.

Preferably, the polyhedron inspection apparatus further includes retrieve means, which distinguishes the inspection object determined as non-defective or defective into non-defective product and defective product and thereafter, retrieves it. The retrieve means is preferably composed of a suction unit having a suction port for the inspection object, and a discharge unit for blowing a gas to the inspection object in the groove so that a pressing force is given to the inspection object. With the configuration, it is possible to securely extrude the inspection object from the groove, and to securely retrieve the non-defective product and the defective product by the suction force of the suction unit.

Further, in the present invention, the passage forming member is composed of a plurality of members divided along a moving direction of the inspection object, and in the down stream side of each passage forming member, a vibration frequency is set higher than the upstream side thereof, and further, the inspection object is movable in a state of estranged from each other using a difference between the vibration frequencies. With the configuration, even if the chip is supplied in a state of closely contacting with each other, it is possible to securely move the chip in a state that the chip is estranged from each other, and thus, to securely inspect individual chips by the inspection means.

In this specification, the terms "V-letter" and "U-letter" used therein are not limited to a groove having symmetrical shape, and include the concept of non-symmetrical shape. Further, the term "U-letter" includes upwardly opened U-letter. In addition, the term "right and left of groove" is used based on the state when viewing the inspection object moving from the upstream side to the downstream side. Thus, in the following description, please note that right and left is shown in reverse in the following drawings. Preferably, the inspection object is a rectangular or cubic solid; however, other solids may be used as the inspection object.

BRIEF DESCRIPTION OF THE DRAWINGS

FIGS. 8(k)–8(t) are sectional views showing an inspection object rotating on a downstream side rotating feed section.

BEST MODE FOR CARRYING OUT THE INVENTION

One embodiment of the present invention will be described below with reference to the accompanying drawings.

Figure 1:
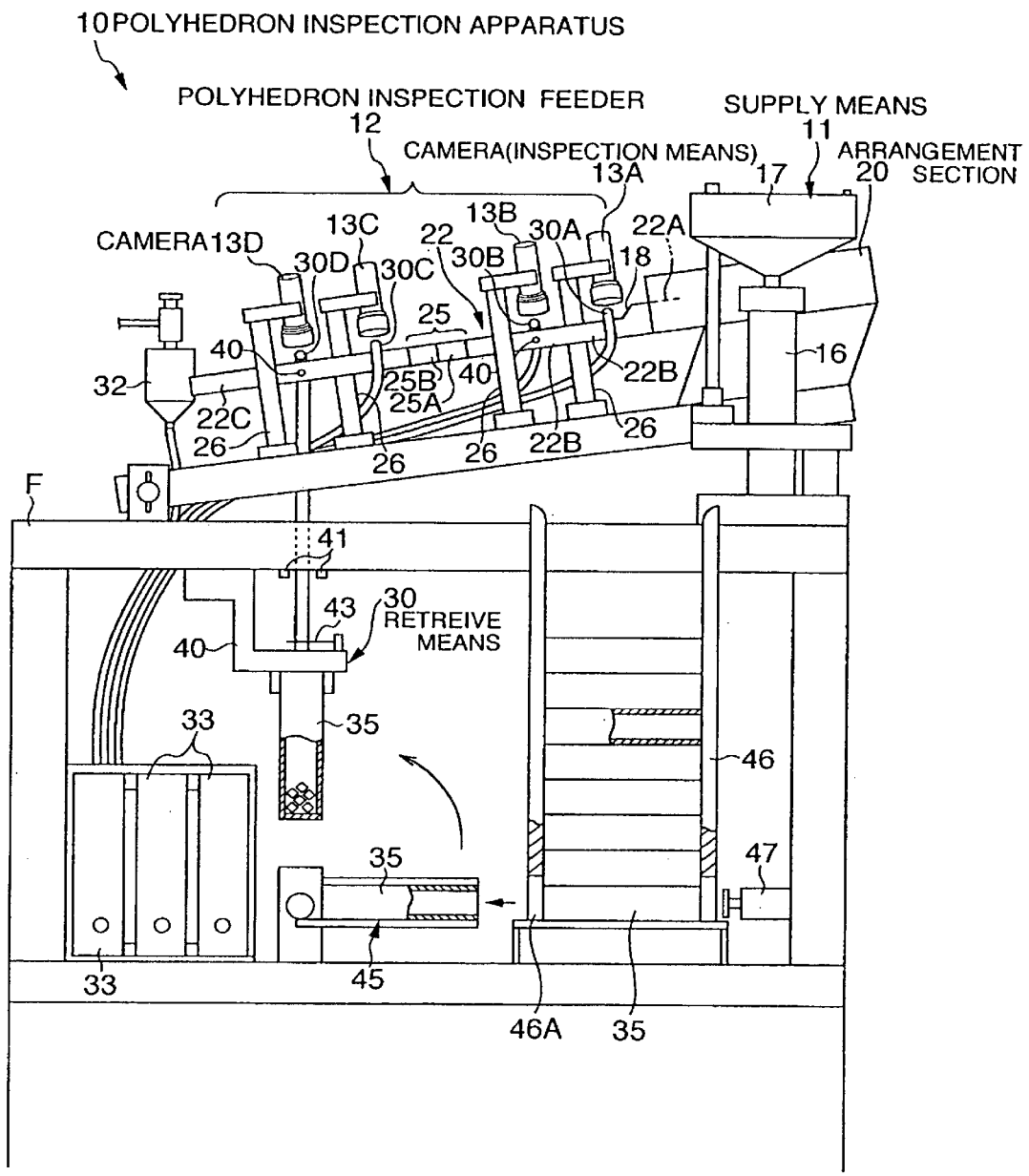
FIG. 1 is a front view schematically showing a polyhedron inspection apparatus according to one embodiment of the present invention.
Figure 2:
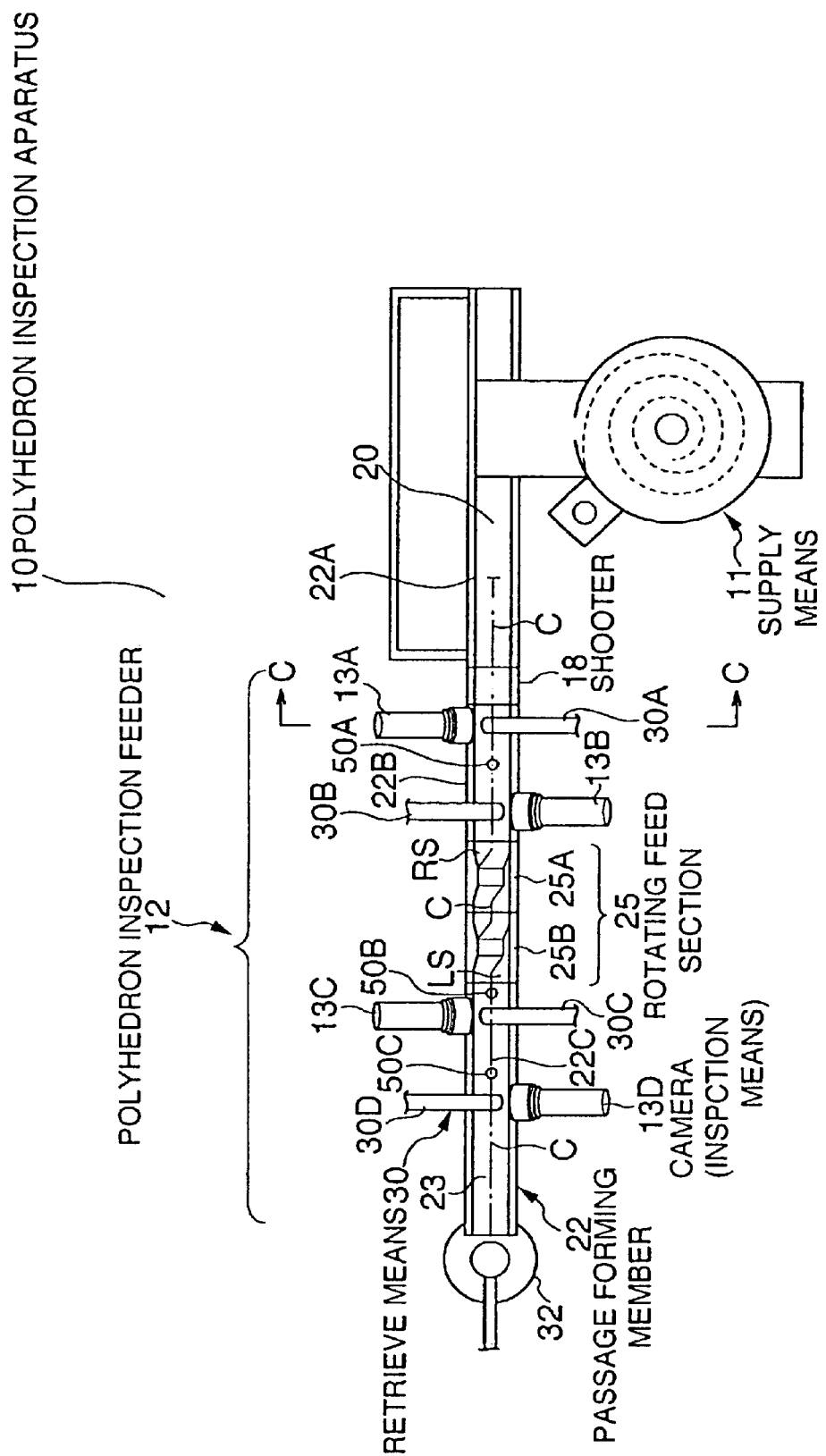
FIG. 2 is a top plan view showing principal parts of the polyhedron inspection apparatus shown in FIG. 1.

FIG. 1 is a front view schematically showing the whole configuration of polyhedron inspection apparatus to which the present invention is applied, and FIG. 2 is a top plan view showing principal parts of the polyhedron inspection apparatus shown in FIG. 1. As shown in FIG. 1 and FIG. 2, the polyhedron inspection apparatus 10 includes a supply means 11, a polyhedron inspection feeder 12 (see FIG. 2), first to fourth cameras 13A to 13D used as inspection means, and a retrieve means 30. More specifically, the supply means 11 is arranged on an upper portion of a frame F, and the polyhedron inspection feeder 12 moves an inspection object supplied from the supply means 11, that is, a cube-like ceramic chip capacitor (hereinafter, referred to as chip W) in this embodiment. The first to fourth cameras 13A to 13D are arranged above the polyhedron inspection feeder 12, and the retrieve means 30 distinguishes and retrieves the chip W in accordance with the inspection result, that is, non-defective or defective.

The supply means 11 is composed of a hopper 17, which is supported to the frame F via a support 16, and an arrangement section 20, which has a proper groove shape suitable for guiding each chip W fed from the upper end portion of the hopper 17 to the outside to the polyhedron inspection feeder 12. The inner side of the hopper 17 is formed into a shape of spiral as well known, and vibration is given to many chips W received in the hopper 17 by a vibrator (not shown), and thereby, the chip W is ejected in succession from upper side of the hopper.

Figure 3:
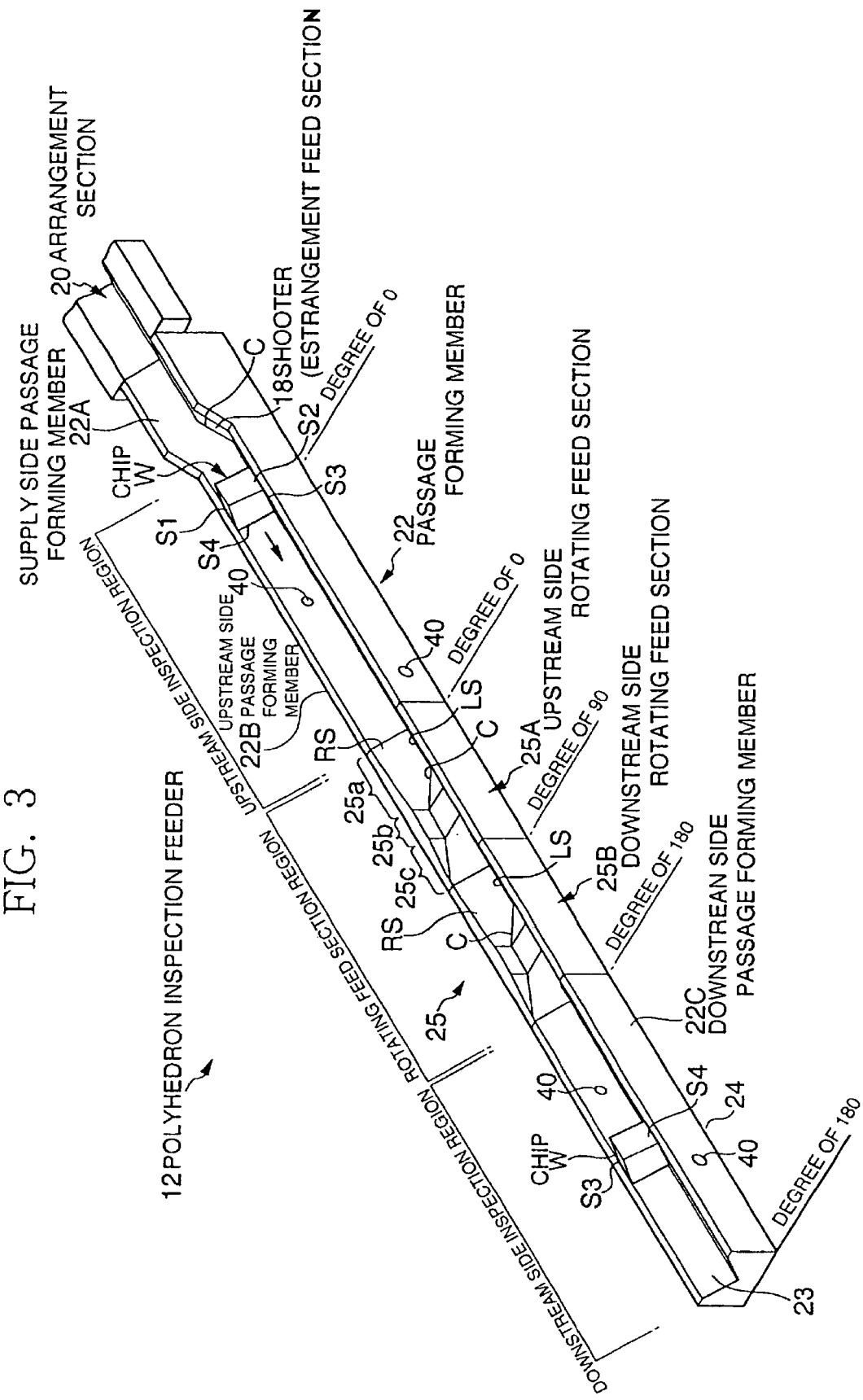
FIG. 3 is a perspective view schematically showing a passage forming member and a rotating feed section.

The polyhedron inspection feeder 12 comprises a groove-like passage forming member 22, which extends approximately linearly from the arrangement section 20, as shown in FIG. 2 and FIG. 3. The passage forming member 22 is arranged at a predetermined angle so that the downstream side, that is, the left-hand side of FIG. 1 is positioned relatively lower than the right-hand side. Further, the passage forming member 22 is composed of a supply side passage forming member 22A (see FIG. 2 and FIG. 3), an upstream passage forming member 22B, an upstream side rotating feed section 25A a downstream side rotating feed section 25B, and a downstream side passage forming member 22C. More specifically, the supply side passage forming member 22A is arranged on the side of the arrangement section 20. The upstream passage forming member 22B communicates with the supply side passage forming member 22A via a shooter 18 used as an estrangement feeder, and forms an upstream side inspection region. The upstream and downstream side rotating feed section 25A and 25B forms a rotating feed region in the upstream side passage forming member 22B. The downstream side passage forming member 22C communicates with these upstream and downstream side rotating feed section 25A and 25B, and forms a downstream side inspection region. The supply side passage forming member 22A, the upstream passage forming member 22B and the downstream side passage forming member 22C are formed into a shape of groove having a substantially V-letter section. The chip W is moved to the downstream side so that one corner of the chip W is positioned to the bottom corner C of substantially V-letter groove 23.

As shown in FIG. 3, the shooter 18 comprises an inclined groove having a substantially V-letter section, which is inclined to the supply side passage forming member 22A so that the upstream side passage forming member 22B is positioned lower than the member 22A in its height. Further, the shooter 18 makes use of an action such that the chip W slips from the supply side passage forming member 22A, and thereby, forms a predetermined interval between the chips W moving from the upstream side passage forming member 22B to the downstream side.

Figure 4:
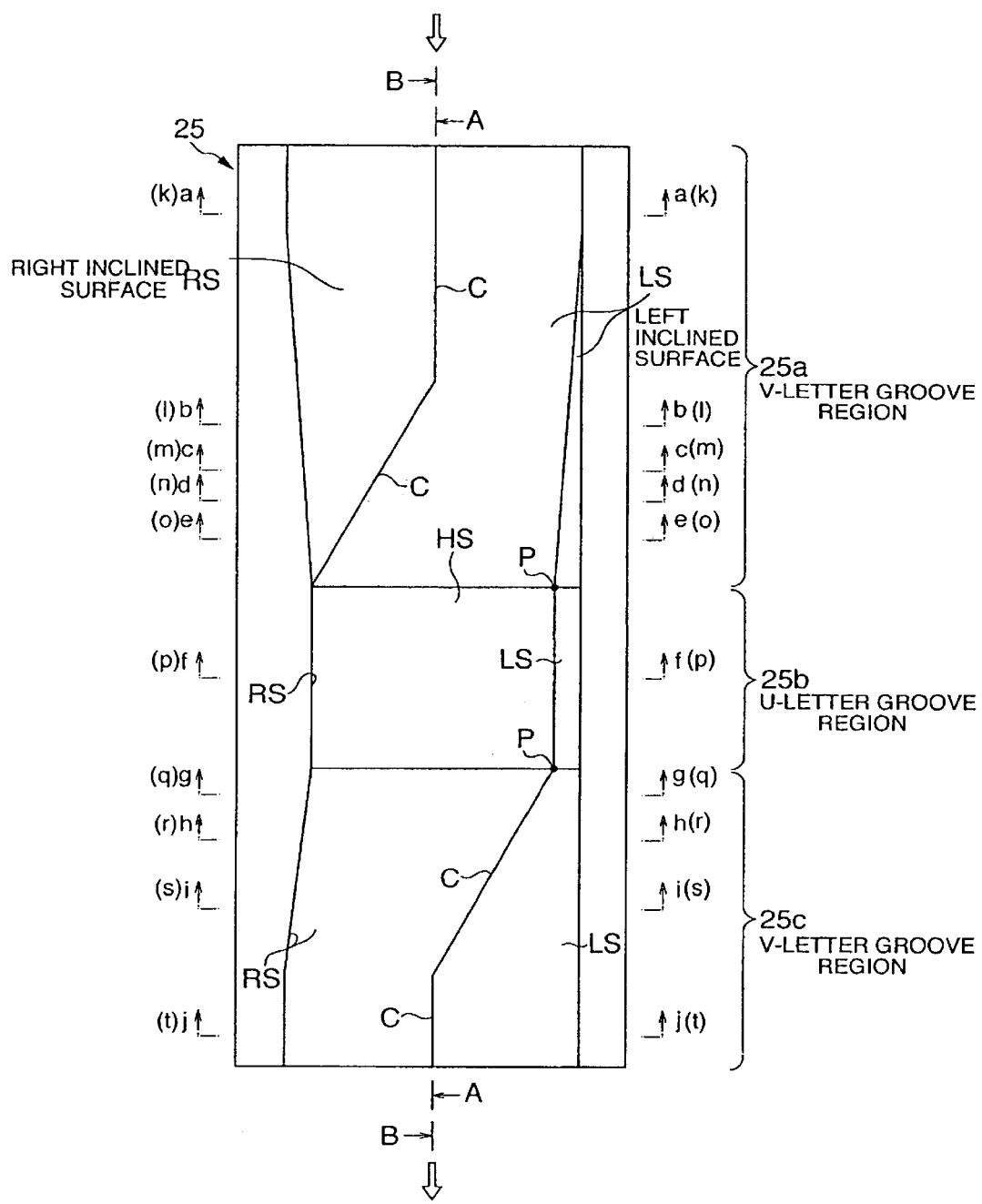
FIG. 4 is an enlarged plan view showing the rotating feed section.
Figure 5:
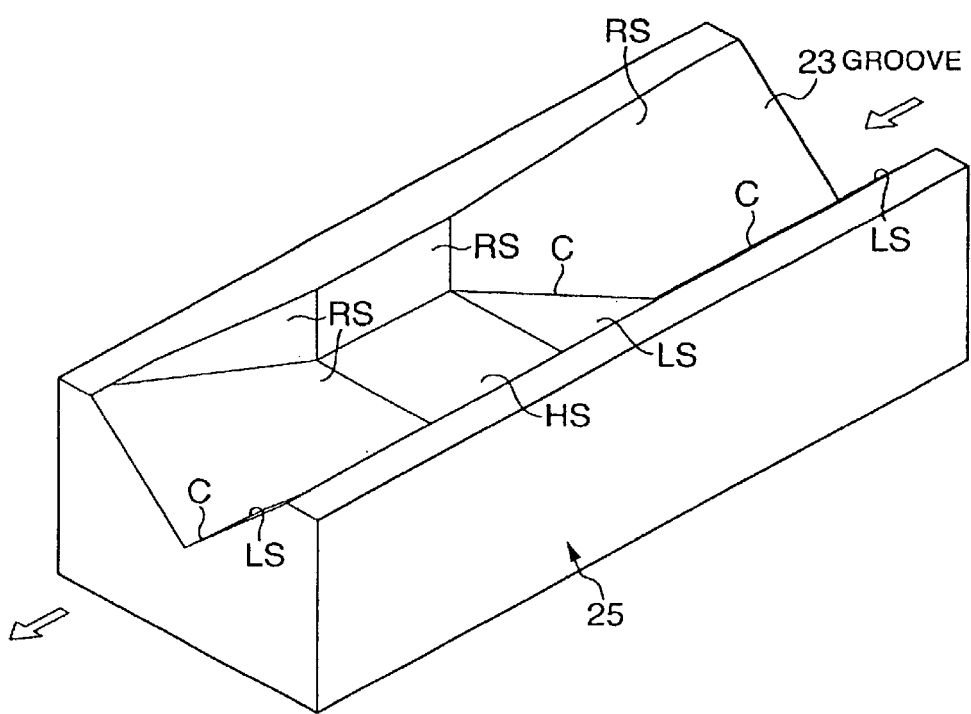
FIG. 5 is an enlarged perspective view showing the rotating feed section.
Figure 6:
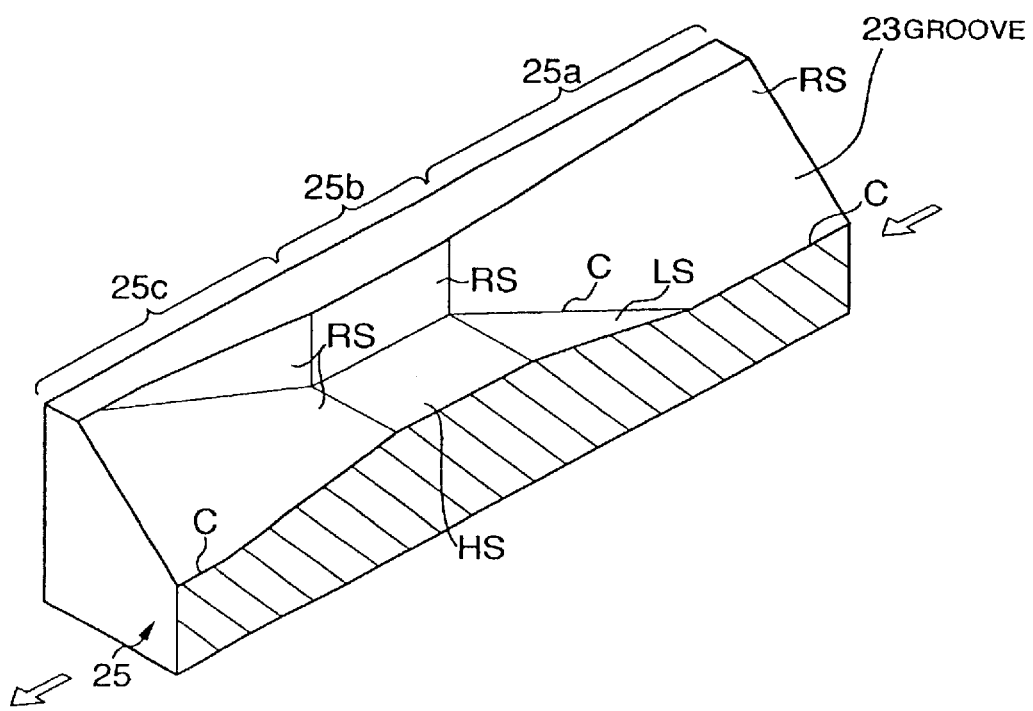
FIG. 6 is a cross sectional view taken along a line A—A of FIG. 4.
Figure 7:
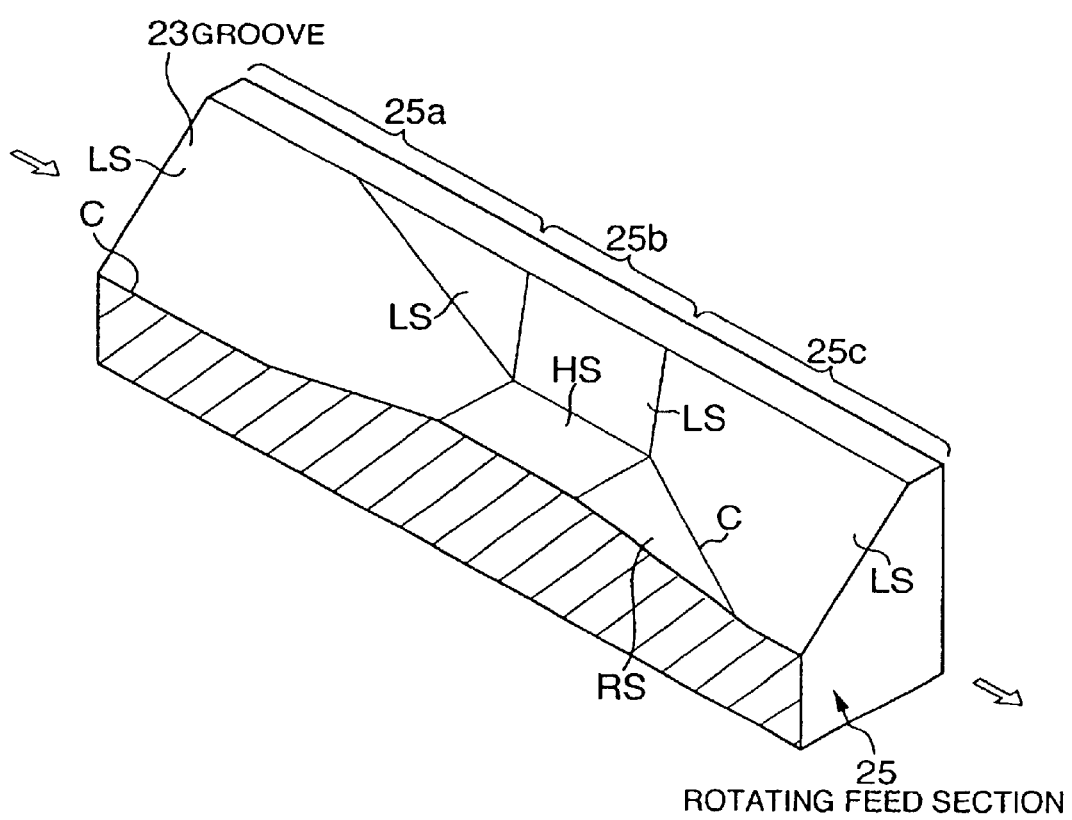
FIG. 7 is a cross sectional view taken along a line B—B of FIG. 4, FIGS. 8(a)–8(i) are sectional views showing an inspection object rotating on an upstream side rotating feed section.

The upstream and downstream side rotating feed sections 25A and 25B are formed into the same shape, and are longitudinally combined with each other in this embodiment The chip W is rotated at an angle of 90° by one of these rotating feed sections 25A or 25B, and thus, can be rotated at an angle of 180° by the combination of these rotating feed sections 25A and 25B. Further, as shown in FIG. 3 to FIG. 7, the upstream and downstream side rotating feed sections 25a and 25B are individually formed with a V-letter groove region 25a, a U-letter groove region 25b and a V-letter groove region 25c in succession from the upstream side toward the downstream side. These groove regions 25a to 25c, are formed into a shape such that each inclined angle of left and right inclined surfaces LS and RS changes along the moving direction of the chip W. More specifically, as shown in FIG. 4, FIG. 6 and FIG. 7, the bottom corner C of the V-letter groove region 25a positioned on the upstream side linearly extends over a predetermined length at the approximately central portion in the widthwise direction of the upstream side rotating feed section 25A Further, the bottom corner C extends so as to slightly rise up while shifting to the right inclined surface RS side from the midway. In this case, the right and left inclined surfaces RS and LS are explanatory concept specified using the corner C as boundary, and not specified using the center of groove width as boundary. In the V-letter groove region 25a, the right inclined surface RS is formed so as to gradually change from the initial inclination of 45° to an angle of approximately 90° as shown in FIG. 6 and FIG. 8(a) to FIG. 8(e). On the other hand, in the left inclined surface LS is formed two-stage inclined surface such that its upper portion is bent at a position of being slightly shifted to the chip moving direction from the initial inclination of 45°. Further, the inclined surface on the lower stage side gradually becomes small in its inclined angle, and thereby, one surface of the chip W, that is, the surface S3 of the chip W in FIGS. 8(a)–8(f) gradually becomes a horizontal state just before it reaches the U-letter groove region 25b.

In the U-letter groove region 25b, as shown in FIG. 8(f), the right inclined surface RS has an inclined angle of approximately 90°; on the other hand, the left inclined surface LS is in a slightly inclined state. Further, the U-letter groove region 25b is formed so as to have a U-letter section such that the lower end surface between these inclined surfaces RS and LS becomes substantially horizontal. Thus, in the U-letter groove region 25b, one surface of the chip W is kept at a substantially horizontal state.

As shown in FIG. 4, FIG. 6 and FIG. 7, the down stream side V-letter groove region 25c (see FIG. 8(j)) extends to the center portion of the width wise direction so as to gradually form a V-letter bottom corner C using a lower end position P (see FIG. 4, FIG. 8(f)) of the left inclined surface LS of the U-letter groove region 25b as a starting point. In this case, the bottom corner C extends to a direction such that the height becomes lower than the starting point (lower end position P). Further, the bottom corner C linearly extends toward the downstream side from the midway at the center position of the widthwise direction. The right inclined surface RS of the V-letter groove region 25c is formed into two-stage inclined surface bent up to the position just before the downstream end, and thus, the chip W is positioned in a state of being rotated by an angle of 90° in the V-letter groove region 25c.

Therefore, the rotating feed sections 25A and 25B are combined with each other, and thereby, it is possible to rotate the chip W by an angle of 180°. As a result, when the chip W has a cubic shape, it is possible to inspect all of four surfaces of cubic chip exclusive of front and rear end faces along the moving direction of the chip W.

In this case, the rotating feed section 25 of this embodiment may be formed with a U-letter groove region, a V-letter groove region and a U-letter groove region in succession from the upstream side toward the downstream side, in addition to the configuration shown in figures. The different type rotating feed section as constructed above can rotate the chip W by an angle of 90°, likewise, and thus, two rotating feed sections are combined, and thereby, it is possible to rotate the chip W by an angle of 180°. Further, even in the case where the different type rotating feed section is combined in place of one of two rotating feed sections 25a and 25B, it is possible to realize the same rotation of chip W as above. In addition, preferably, the right and left inclined surfaces RS and LS are finished so as to smoothly continue along the moving direction of the chip W.

Figure 10:
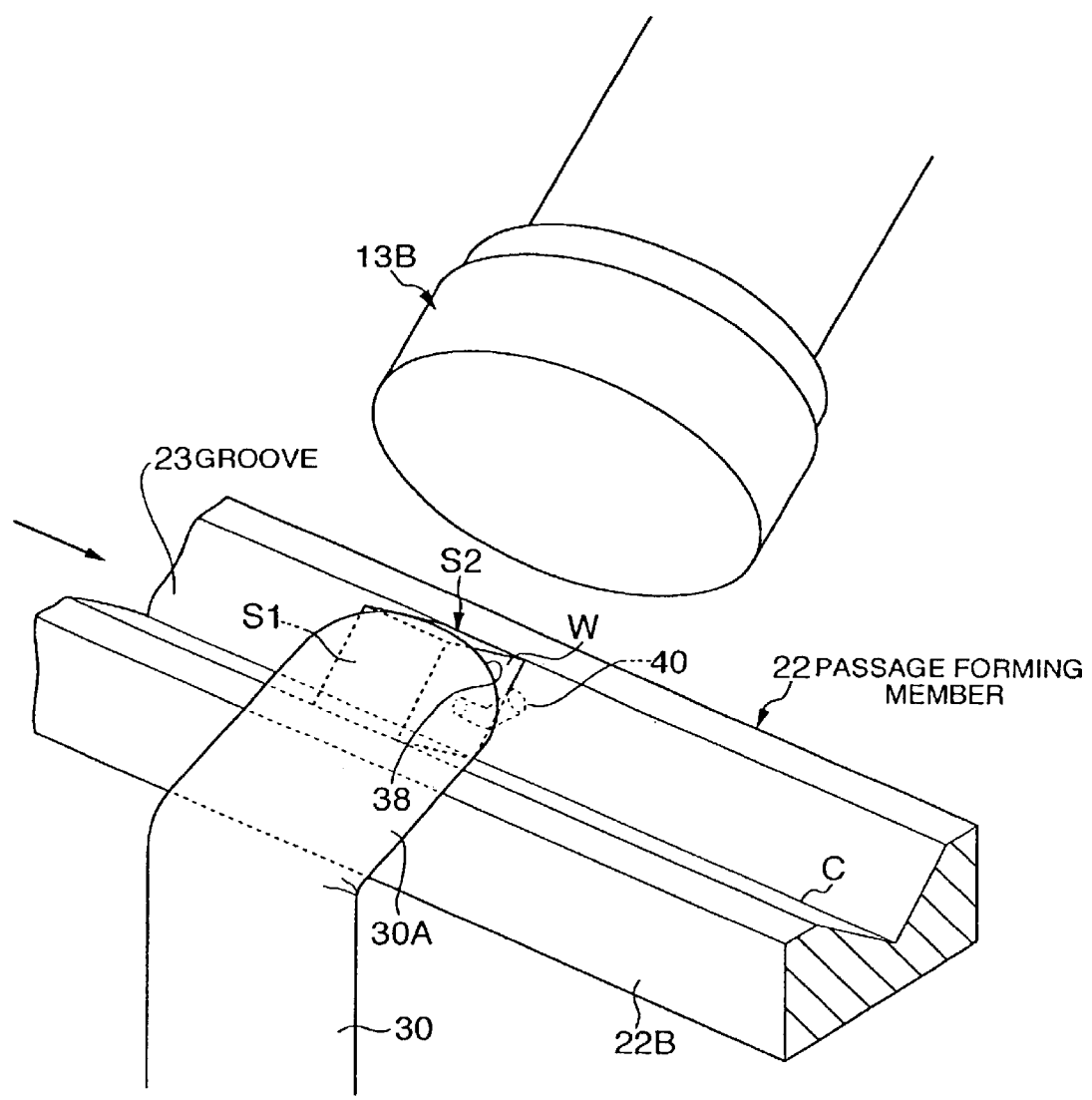
FIG. 10 is a perspective view schematically showing a positional relation between a camera and a suction pipe when inspecting an inspection object.

The first to fourth cameras 13A to 13D used as inspection means are individually supported on the frame F via a stand 26 (see FIG. 1). The first and second cameras 13A and 13B are positioned above the upstream side passage forming member 22B of the passage forming member 22, and are arranged so that each lens of the cameras 13A and 13B faces an inspection surface of the chip W. More specifically, the first camera 13A inspects a surface S1 (see FIG. 11) of the chip W; on the other hand, the second camera 13B inspects a surface S2 (see FIG. 10) of the chip W. Further, the third and fourth cameras 13C and 13D are positioned above the downstream side passage forming member 22C, and are arranged so that each lens of the cameras 13A and 13B faces an inspection surface of the chip W, likewise. The third camera 13C inspects a surface S3 of the chip W exposed passing through the rotating feed sections 25a and 25B; on the other hand, the fourth camera 13D inspects a surface S4 of the chip W. These cameras 13A to 13D are connected to an image processor, which carries out a predetermined image processing inspection, and thereafter, it is determined whether the chip W is non-defective or defective.

Figure 11:
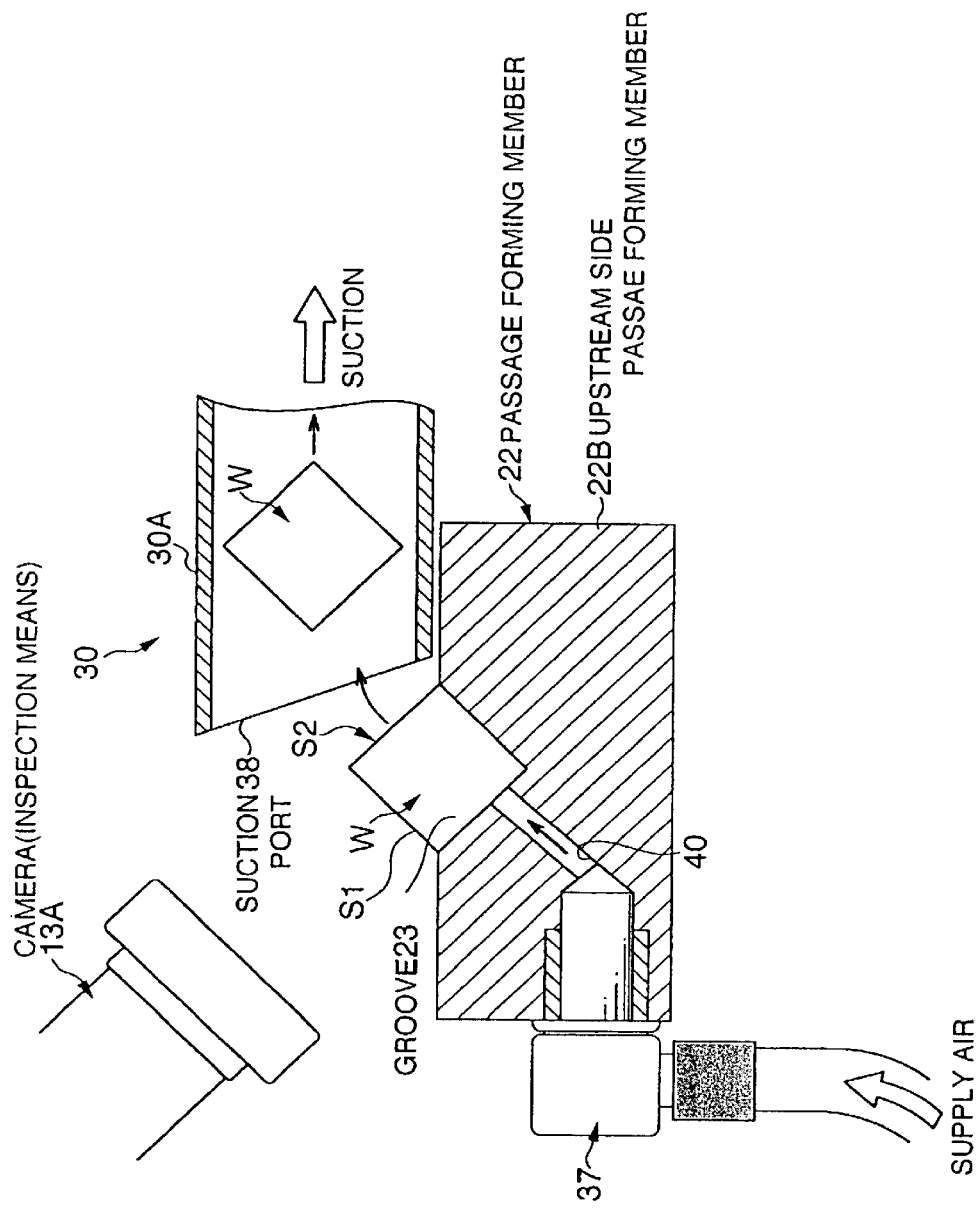
FIG. 11 is an enlarged sectional view taken along an arrow line C—C of FIG. 2.

As shown in FIG. 1, the retrieve means 30 is composed of first to fourth retrieve pipes 30A to 30D, a remaining chip retrieve section 32, a defective product retrieve case 33, a non-defective product retrieve case 35, and a discharge unit 37 (see FIG. 11). More specifically, the first to fourth retrieve pipes 30A to 30D are provided so as to correspond to the above first to fourth cameras 13A to 13D, the remaining chip retrieve section 32 is arranged on the downstream side of the passage forming member 22. The defective product retrieve case 33 is connected to the first to third retrieve pipes 30A to 30C and the remaining chip retrieve case 32, and the non-defective product retrieve case 35 is connected to the fourth retrieve pipe 30D. The discharge unit 37 is provided so as to correspond to each of the retrieve pipes 30A to 30D, and blows gas, that is, air against the chip W in the upstream and downstream side passage forming members 22B and 22C of the passage forming member 22 so that a pressing force is given to the chip W. In this case, the first to fourth retrieve pipes 30A to 30D and the discharge unit 37 individually have the same structure; therefore, the first retrieve pipe 30A and the discharge unit 37 corresponding to there will be described below.

As shown in FIG. 11, the first retrieve pipe 30A has an opening suction port 38 at the distal end thereof, and the suction port 38 is formed into a shape of being obliquely cut so as not to hinder the pickup by the camera 13A. Further, the first retrieve pipe 30A is connected to a pressure reducing unit (not shown), and is always in a state of being sucked.

The discharge unit 37 is connected to an air supply hole 40 penetrating through the groove 23 from the outer side of the passage forming member 22, and further, is connected to a compressor (not shown) so that air can be blown to the chip W via the air supply hole 40. In the discharge unit 37, two actions, that is the pressing force by the discharge unit 37 and a suction force by the first retrieve pipe 30A are given to a chip W determined as defective product by the image processor, and thereby, the chip W is collected to the defective product retrieve case 33.

The fourth retrieve pipe 30D is used for collecting a chip W determined as non-defective product to the non-defective product retrieve case 35. The chip W, which has not been retrieved by the fourth retrieve pipe 30D, is positively regarded as defective product, and then, is collected to the defective product retrieve case 33 via the remaining chip retrieve section 32.

The non-defective product retrieve case 35 is supported to the lower end position of the fourth retrieve pipe 30D via a bracket 40, and receives the chip W retrieved by the fourth retrieve pipe 30D in an upwardly opened state. Then, when the predetermined number of chips is received in the non-defective product retrieve case 35, the chips are fed to an after-treatment process via a transfer means (not shown). In this case, the number of non-defective products is counted by an optical sensor 41 provided on the midway of the retrieve pipe 30D. Further, the retrieve pipe 30D is provided with a shutter 43 at the position just before the pipe. The shutter 43 temporarily stops the chip W from dropping in the non-defective product retrieve case 35 when the chip reaches the preset number of non-defective products.

Further, the non-defective product retrieve case 35 is set to a retrieve position by a rotary arm 45 arranged below the bracket 40, and a magazine 46 is arranged at the position adjacent to the rotary arm 45. The magazine 46 receives the non-defective retrieve case 35 stocked in a horizontally positioned state. At the position adjacent to the lower end of the magazine 46, the frame F is provided with an extruder (ejector) 47 comprising a cylinder or the like. By the extruder 47, the lowest positioned non-defective product retrieve case 35 is extruded from a lower opening 46A of the magazine 46, and then, is transferred to the rotary arm 45.

Figure 9A:
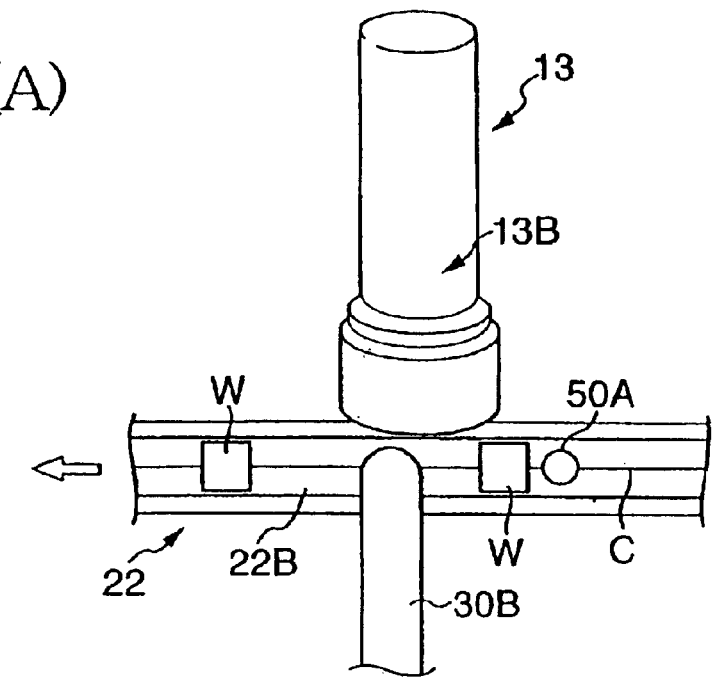
FIG. 9(A) is a ton plan view schematically showing an arrangement of nozzle for keeping an estranged state between chips.
Figure 9B:
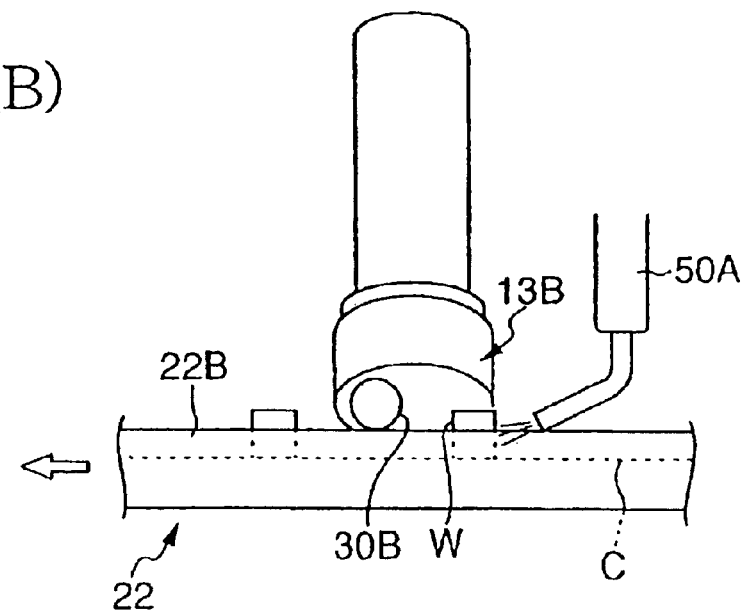
FIG. 9(B) is a front view schematically showing the arrangement of FIG. 9(A)

As shown in FIG. 2 and FIGS. 9(A)–9(B) nozzles 50A, 50B and 50C are arranged on the passage forming member 22 at the vicinity of each upstream side of the second to fourth cameras 13B, 13C and 13D, respectively. Air is jetted out of these nozzles 50A to 50C, and thereby, the feed of the chip W is facilitated; therefore, an estranged state between the chips W is kept. By doing so, it is preferable that the interval between the chips W is not made narrow.

Subsequently, the inspection method of chip W in this embodiment will be detailedly described below with reference to FIGS. 8($a$)–8($t$). In this case, FIGS. 8($a$)–8($i$) are cross sectional views showing the chip W moving on the groove 23 of the rotating feed section 25A positioned on the upstream side. FIGS. 8($k$)–8($t$) are cross sectional views showing the chip W moving on the groove of the rotating feed section 25B positioned on the downstream side.

When the inspection start instruction is given, the hopper 17 and the passage forming member 22 are vibrated by the vibrator (not shown). By doing so, the chip W is successively supplied onto the supply side passage forming member 22A of the passage forming member 22 from the upper portion of the hopper 17 via the arrangement section 20. The chip W on the supply side passage forming member 22A is moved to the downstream side because the downstream side of the passage forming member 22 is positioned lower and the chip W receives a constant vibration. In this case, even if the chip W is moved in a state that front and rear end faces of each chip closely contact with each other, the chip W passes through the shooter 18, and thereby, a constant interval is formed between the chips W. Therefore, when moving on the upstream side passage forming member 22B, the chip W is moved one by one in a state of being estranged from each other.

On the upstream side passage forming member 22B, two surfaces of the chip W, that is, surfaces S1 and S2 shown in figures are inspected by the first and second cameras 13A and 13B. In this case, for example, when the inspection result is made by the first camera 13A that the surface S1 of the chip W is defective, the discharge unit 37 blows a gas. Then, the discharge unit 37 instantaneously strongly blows the chip W to a direction of pushing up the chip W by suction of the retrieve pipe 30A corresponding to the first camera 13A, and thereby, the chip W can be guided into the retrieve pipe 30A.

On the other hand, the chip W, which is determined as being non-defective by the first and second cameras 13A and 13B, is moved to the rotating feed sections 25A and 25B. Then, in the upstream side rotating feed section 25A, as shown in FIGS. 8($a$)–8($i$), the surface of the chip W positioned in the V-letter groove region 25$a$ is kept at an angle of approximately 45°. At that time, the uppermost positioned corner of the chip W is shown by a square blacked mark ■ in FIGS. 8($a$)–8($t$) and this position is set as angle of 0°. When the chip W is moved from the V-letter groove region 25$a$ to the U-letter groove region 25$b$ (see FIG. 8($f$)), the chip W is rotated by an angle of 45°, and then, is moved from the U-letter groove region 25$b$ to the V-letter groove region 25$c$ (see FIG. 8($j$)), and thereby, is further rotated by an angle of 45°. Thus, the chip W is rotated from the initial angle 0° to 90°. This state coincides with the initial position where the chip W is moved to the downstream side rotating feed section 25B, as shown in FIG. 8($k$) connected to the downstream side rotating feed section 25B. In the downstream side rotating feed section 25B, the chip W is rotated by an angle of 90° (see, FIGS. 8(k)–8(t)), like the upstream side rotating feed section 25A; as a result, the chip W is rotated by an angle of 180° by combining two rotating feed sections 25A and 25B.

When the chip W is rotated by an angle of 180° in the above manner, the initial stage, that is, two surfaces S3 and S4 of the chip W, which have not been exposed on the upstream side passage forming member 22B, are exposed. Then, two surfaces S3 and S4 thus newly exposed are inspected by the third and fourth cameras 13C and 13D on the downstream side passage forming member 22C.

In the case where the surfaces S3 and S4 of the chip W are determined as non-defective by both third and fourth cameras 13C and 13D, the suction pipe 30D and the discharge unit 37 corresponding to the fourth camera 13D are operated so as to suck the chip W into the non-defective retrieve case 35.

On the other hand, when the surface S4 of the chip W is determined as defective by the fourth camera 13D, the discharge unit 37 corresponding to the fourth camera 13D is not operated so that the chip W is intactly moved to the downstream side. Then, the chip W is collected into the defective product retrieve case 33 via the remaining chip retrieve section 32 provided on the downstream side of the passage forming member 22.

Therefore, according to this embodiment, the following effects can be obtained. More specifically, it is possible to automatically inspect all of four surfaces S1 to S4 of the chip W by the movement of the chip W to linear direction, exclusive of both end faces of cubic and rectangular chips in the moving direction. Further, when the chip W is determined as defective by each image processing of the cameras 13A to 13D, in order to retrieve the defective chip W, the pressing force by the discharge unit 37 and the suction of the retrieve pipes 30A to 30D are used in combination. Thus, it is possible to effectively prevent non-suction when the chip W is determined as defective, and to reduce a possibility such that defective products are mixed in non-defective products. In addition, even if the chip W moves in a state of closely contacting with each other in the supply side passage forming member 22A, a constant interval is formed for each chip W on the upstream side passage forming member 22B by the shooter 18. By doing so, it is possible to carry out the inspection by the cameras 13A to 13D in a state that chips W to be inspected is estranged one by one; therefore, inspection mistake can be prevented from being made, and erroneous suction can be prevented.

In this embodiment, the rotating feed section 25 has been constructed in a manner that V-letter, U-letter and V-letter groove regions are arranged in succession. The present invention is not limited to the embodiment, U-letter, V-letter and U-letter groove regions may be arranged. In this case, the upstream side passage forming member 22B is formed so that the groove shape is V-letter at the upstream side, and gradually changes to U-letter shape toward the downstream side. On the other hand, the downstream side passage forming member 22C is formed so that the groove shape is U-letter at the upstream side, and gradually changes to V-letter shape toward the downstream side. In short, according to the present invention, various groove shapes may be employed so long as the chip W can be moved with the rotation along spiral locus.

Further, the appearance of chip W shown in this embodiment is a shape for convenience of explanation of the present invention, and the shape of the chip W, which is the actual inspection object, is not specified. For example, the inspection surface is not limited to four, and may be three or five surfaces or more. In accordance with the number of inspection surfaces, the number of the rotating feed sections 25 is increased or decreased while changing the number of the cameras 13A to 13D.

Further, the polyhedron inspection apparatus 10 of the present invention is not limited to the whole configuration as shown in figures, and various design modifications are possible so long as the substantially same effect and operation can be obtained. For example, in the embodiment, when the fourth camera 13D determines that the chip W is non-defective, the chip W has been sucked into the non-defective product retrieve case 35 in response to the inspection result. In this case, the non-defective product is retrieved to the remaining chip retrieve section 32, and then, when the fourth camera 13D determines that the chip W is defective, the defective product can be retrieved to the defective product retrieve case 33 by the corresponding suction pipe 30D.

Further, in the embodiment, in the case of moving the chip W, the vibration by vibrator has been given to the chip W. The present invention is not limited to this embodiment, and a compression air and other forced transport method may be employed. In addition, the inspection means is not limited to camera, and may be replaced with other means so long as the surface accuracy of the chip W can be detected.

Further, in the embodiment, the chip W has been continuously supplied by vibration by the vibrator (not shown) provided on the supply means 11, and then, has been moved on the polyhedron inspection feeder 12 using the shooter 18 in a state of being estranged one by one. In this case, other means for estranging the chip W may be employed. For example, the supply side passage forming member 22A and the upstream side passage forming member 22B are supported so that vibration is given to them independently from each other, and the upstream side passage forming member 22B is vibrated by a relatively high frequency, and thereby, it is possible to separate the chip W. In addition, the upstream side passage forming member 22B and the downstream side passage forming member 22C are supported so that vibration is given to them independently from each other, and the downstream side passage forming member 22C is vibrated by a relatively high frequency, and thereby, it is possible to keep a estranged state of the chip W. By doing so, for example, even if the chip W is supplied in a state of closely contact with each other, the interval between the chips W is securely formed; therefore, it is possible to securely inspect individual chips W by the cameras 13A to 13D used as the inspection means.

As is evident from the description, according to the present invention, the polyhedron inspection feeder has the passage forming member, which is formed into a shape of groove. Further, the polyhedron inspection feeder is provided with the rotating feed section, whose groove has right and left inclined angle changing along the moving direction of the inspection object so that the chip is rotated by a predetermined angle. Therefore, when moving the inspection object on the passage forming member, it is possible to rotate and move the inspection object like a spiral locus. As a result, the inspection object, that is, the chip can be moved in a state of exposing the inspection surface of chip hidden in the groove in the initial movement. Therefore, it is possible to polyhedraly inspect defects such as scratch and deformation on the surface of the inspection object without carrying out visible inspection, and thus, to effectively perform inspection with high accuracy. In addition, the inspection object is moved while rotating; therefore, it is possible to linearly form the passage forming member, and thus, to achieve device miniaturization.

In particular, the rotating feed section is formed in a manner that V-letter type, U-letter type and V-letter type grooves or U-letter type, V-letter type and U-letter type grooves are arranged in succession in the cross sectional shape. Therefore, it is possible to move the inspection object while rotating it by slightly modifying a design of the groove shape, and no problem arises such that manufacture cost becomes high. In addition, the rotating feed section is supplied as component, and thereby, it is possible to obtain versatility such that the rotating feed section is applicable to already existing equipments.

Further, according to the present invention, the upstream or downstream side of the rotating feed section having the arrangement of V-letter type, U-letter type and V-letter type sectional groove shape, is combined with the rotating feed section having the arrangement of U-letter type, V-letter type and U-letter type sectional groove shape. Two rotating feed sections having the arrangement of V-letter type, U-letter type and V-letter type sectional groove shape are continuously combined with each other. In addition, two rotating feed sections having the arrangement of U-letter type, V-letter type and U-letter type sectional groove shape are continuously combined with each other. By doing so, the rotational angle of the inspection object can be twice. Moreover, it is possible to improve a degree of freedom of design by the combination with the different type rotating feed section.

Further, in the polyhedron inspection apparatus of the present invention, it is possible to automatically inspect each surface of the inspection object, and besides, even if the inspection object is continuously supplied from the supply means in a state of closely contacting with each other, the estrangement feed section for the inspection object forms a predetermined interval between the inspection objects. Therefore, it is possible to securely specify the inspection object one by one, and to carry out the inspection by the inspection means; as a result, an inspection mistake can be prevented.

Further, the polyhedron inspection apparatus is provided with the retrieve means, which distinguishes the inspection object determined as non-defective or defective into non-defective product and defective product, and thereafter, retrieves it. The retrieve means is composed of the suction unit and the discharge unit. By doing so, it is possible to securely extrude the inspection object from the groove, and to securely retrieve the non-defective product and the defective product in cooperation with the suction force of the suction unit. As a result, the present invention can provide a polyhedron inspection apparatus, having the effect, which has not been perform in the conventional case.

Furthermore, the passage forming member is composed of a plurality of members divided along a moving direction of the inspection object and a vibration frequency in the downstream side of each passage forming member is set higher than the upstream side thereof, the inspection object is movable in a state of estranged from each other using a difference between the vibration frequencies, so that, even if the chip is supplied in a state of closely contacting with each other, it is possible to securely move the chip in a state that the chip is estranged from each other, and thus, to securely inspect individual chips by the inspection means.

INDUSTRIAL APPLICABILITY

The present invention is applicable as an apparatus, which can inspect a finished surface accuracy of electronic components such as ceramics chip capacitor or the like.

What is claimed is:

1. A polyhedron inspection feeder, comprising a passage forming member for moving an object to be inspected in a predetermined moving direction, wherein the passage forming member includes a groove that has first and second opposite side walls having first and second inclined angles, respectively, said first and second inclined angles varying along the moving direction of the object so that the object is rotated by a predetermined angle while being moved in said moving direction; and said groove comprises segments having U-shaped, V-shaved and U-shaved cross sections, respectively.

2. The polyhedron inspection feeder of claim 1, comprising two said passage forming members which are continuously combined with each other.

3. The polyhedron inspection feeder of claim 2, wherein the grooves of said passage forming members are successively arranged along the moving direction of the object.

4. The polyhedron inspection feeder of claim 1, wherein said segments having U-shaped, V-shaped and U-shaped cross sections, respectively, are arranged in the recited order along the moving direction of the object.

5. The polyhedron inspection feeder of claim 4, comprising two said passage forming members the grooves of which are successively arranged along the moving direction of the object.

6. The polyhedron inspection feeder of claim 1, wherein the first and second side walls define therebetween a constant angle in the segment of V-shaped cross section, and the first side wall and a bottom of said groove define therebetween said constant angle in the segments of U-shaped cross section.

* * * * *